United States Patent [19]

Obinata

[11] Patent Number: 4,624,767
[45] Date of Patent: Nov. 25, 1986

[54] SPUTTER ETCHING APPARATUS HAVING A SECOND ELECTRICALLY FLOATING ELECTRODE AND MAGNET MEANS

[75] Inventor: Hisaharu Obinata, Hatano, Japan
[73] Assignee: Nihon Shinku Gijutsu Kabushiki Kaisha, Chigasaki, Japan
[21] Appl. No.: 703,369
[22] Filed: Feb. 20, 1985
[51] Int. Cl.$^4$ ............................................. C23C 14/00
[52] U.S. Cl. ...................................... 204/298; 156/345
[58] Field of Search ........................... 204/298, 192 E; 156/345, 654, 657

[56] References Cited

U.S. PATENT DOCUMENTS

| | | | |
|---|---|---|---|
| 3,325,394 | 6/1967 | Kay et al. | 204/298 |
| 3,669,861 | 6/1972 | Cash, Jr. et al. | 204/298 |
| 4,025,410 | 5/1977 | Stewart | 204/298 |
| 4,033,843 | 7/1977 | Krikorian et al. | 204/298 X |
| 4,333,814 | 6/1982 | Kuyel | 204/298 |
| 4,349,409 | 9/1982 | Shibayama et al. | 204/298 X |
| 4,352,725 | 10/1982 | Tsukada | 204/298 X |
| 4,426,274 | 1/1984 | Ephrath | 204/298 |
| 4,431,473 | 2/1984 | Ohano et al. | 204/298 X |

FOREIGN PATENT DOCUMENTS 0040081 11/1981 European Pat. Off.

OTHER PUBLICATIONS

"High-Rate Reactive Ion Etching of SiO$_2$ Using a Magnetron Discharge", Japanese Journal of Applied Physics, Hirike et al, vol. 20, No. 11.
"Studies on the Damage of Si Surface Caused by Reactive Sputter Etching", Journal of the Japan Society of Precision Engineering, vol. 47, No. 12, by Miyake et al.
IBM Technical Disclosure Bulletin, vol. 26, No. 2, Jul. 1983, pp. 866–869.
Japan Abstract 55-38043.
Japan Abstract 58-22381, Apr. 23, 1983; vol. 7, No. 97.

Primary Examiner—John F. Niebling
Assistant Examiner—Nam X. Nguyen
Attorney, Agent, or Firm—Armstrong, Nikaido, Marmelstein & Kubovcik

[57] ABSTRACT

Sputter etching apparatus which includes a sputter etching electrode for mounting a substrate in a vacuum treatment chamber and another electrode oppositely facing the sputter etching electrode. The other electrode is in an electrically floating condition; that is, it is electrically insulated from contact with the chamber structure and from direct connection with the power source. Plasma generated is confined between the two electrodes. An annular magnetic field can be generated surrounding the space confining the plasma to further concentrate it.

3 Claims, 4 Drawing Figures

SPUTTER ETCHING APPARATUS HAVING A SECOND ELECTRICALLY FLOATING ELECTRODE AND MAGNET MEANS

BACKGROUND OF THE INVENTION

This invention relates to an apparatus for sputter etching a substrate such as a silicon substrate or the like.

A previously known apparatus is shown in FIG. 1, for instance. A vacuum treatment chamber a has a sputter etching electrode c supporting a substrate b. The electrode c is applied with DC power or RF electric power from an electric power source d to generate a plasma e in front thereof. Ions contained in the plasma e may impinge on the substrate b to etch the same.

This type of apparatus, however, is defective in that a sufficiently high plasma concentration cannot be obtained because the plasma e is diffused ahead of the electrode c. Consequently, the etching rate, that is, an etching depth per unit time becomes low.

As for a means for heightening the plasma concentration, the application of the electric power can be increased to the electrode c. This, however, is counter-productive in that if the electric voltage of the electrode c is increased, the energy of the ions impinging on the substrate b also becomes high. Consequently, damage to a pattern to be formed on the substrate b or a lowering in characteristics of the pattern are liable to occur. Such difficulties are especially liable to occur with respect to a thin or brittle substrate or a sensitive element such as LSI, a VLSI or the like. In addition, in a case where the substrate b is made of silicon and is sputter etched by Ar ions, innumerable fine injuries on account of lattice defects thereof are given to the surface of the treated substrate. Such fine injuries deteriorate the electrical characteristics of such a product as a fine pattern of a VLSI element or the like, and cause a hindrance to making a more fine pattern.

OBJECTS AND SUMMARY OF THE INVENTION

A first object of this invention is to provide an apparatus whereby the concentration of a plasma generated in front of an etching electrode can be increased without an increase in application of electric power to the electrode, to improve the etching rate.

A second object of this invention is to provide an apparatus whereby a substrate can be prevented from suffering fine injuries when subjected to an etching treatment.

According to this invention, an apparatus having a sputter etching electrode supporting a substrate in a vacuum treatment chamber and the electrode is arranged to be applied with DC or RF electric power for generating a plasma in front thereof for applying sputter etching to the substrate, is characterized in that an opposite electrode which is in an electrically floating condition is provided to face the sputter etching electrode so that the plasma may be confined in a space formed between the two electrodes.

According to a second feature of this invention, in the foregoing arrangement, the apparatus is characterized in that there is provided a magnet means for creating a magnetic field extending in the axial direction along a peripheral open region surrounding the space formed between the two electrodes so that the plasma may be confined in the space defined by not only the two electrodes, but also the surrounding magnetic field.

DETAILED DESCRIPTION OF PREFERRED EMBODIMENTS

Figure 2:
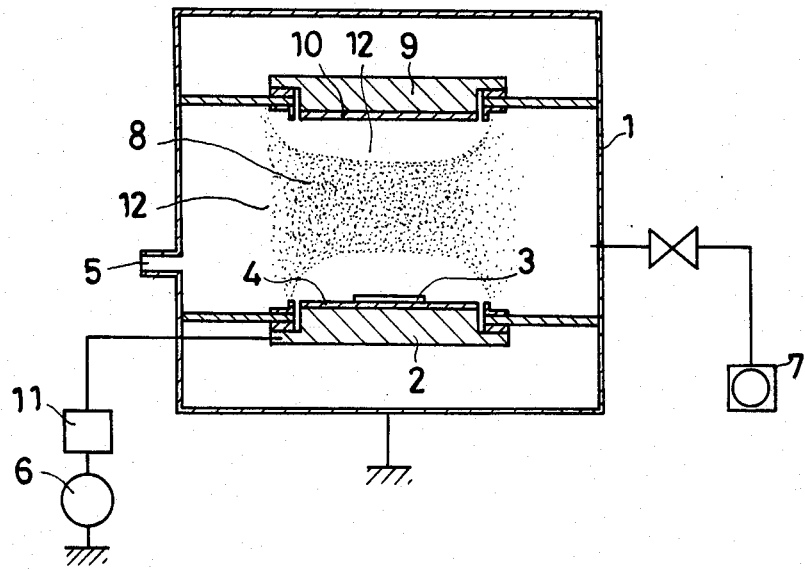
FIG. 2 is a sectional side view of one embodiment of this invention.

Embodying examples of this invention will be explained with reference to the accompany drawings:

Referring to FIG. 2 showing one example thereof, a vacuum treatment chamber has therein a sputter etching electrode 2 in the form of a plate made of an electrically conductive material such as SUS, Cu or the like. A substrate 3 such as a substrate of silicon or the like is placed on the electrode 2 on a base plate 4 of $SiO_2$ or the like. An inlet opening 5 is provided for introducing an etching gas such as Ar, $CF_4$ or the like. An electric power source 6 of DC or RF type and a vacuum pump 7 are connected to the chamber 1. If the vacuum treatment chamber 1 is evacuated and is charged with a slight amount of the etching gas, and the etching electrode 2 is applied with a DC or RF electric power, then a plasma 8 is generated in front of the electrode 2. Ions contained in the plasma 8 impinge on the substrate 3 to sputter etch the same. In the conventional case, the plasma 8 is liable to be diffused forward ahead of the sputtering electrode 2 and if the concentration thereof in front of the electrode 2 is not sufficiently high, the concentration of ions impinging on the substrate 3 is decreased. As a result, the etching rate is decreased.

For improving this defect, according to this invention, an opposite electrode 9 in the form of a plate which is in an electrically floating condition in that the plate 9 is not connected to an electric power source is provided to face the etching electrode 2 so that the plasma 8 generated in front of the electrode 2 may be restricted from diffusing forward by the opposite electrode 9. That is, the plate 9 is electrically insulated from connection with the treatment chamber 1 structure and also from any direct connection with the power source 6. The plasma is thus confined in a space 12 formed between the two electrodes 2, 9 as shown in FIG. 2. As a result, the concentration of the plasma 8 in front of the electrode 2 can be increased without increase in application of the electric power to the etching electrode 2.

In addition, the increasing of the concentration of the plasma 8 causes an increase in an amount of ions in the plasma. This results in an increase in the amount of ions impinging on the substrate 3, so that the rate of etching of the substrate 3 can be improved. In addition, because the plasma concentration can be increased without increasing the electric power to the etching electrode 2 as mentioned above, a sufficient potential of the electrode 2 can be comparatively low whereat ions impinging on the substrate 3 cannot injure the substrate 3.

A base plate 10 of $SiO_2$ or the like is provided on the surface of the opposite electrode 9. When the electric power source 6 is an RF type, a matching box 11 is interposed in a circuit connecting between the electrode 2 and the source 6 so that the electrode 2 may be given a negative potential.

Figure 3:
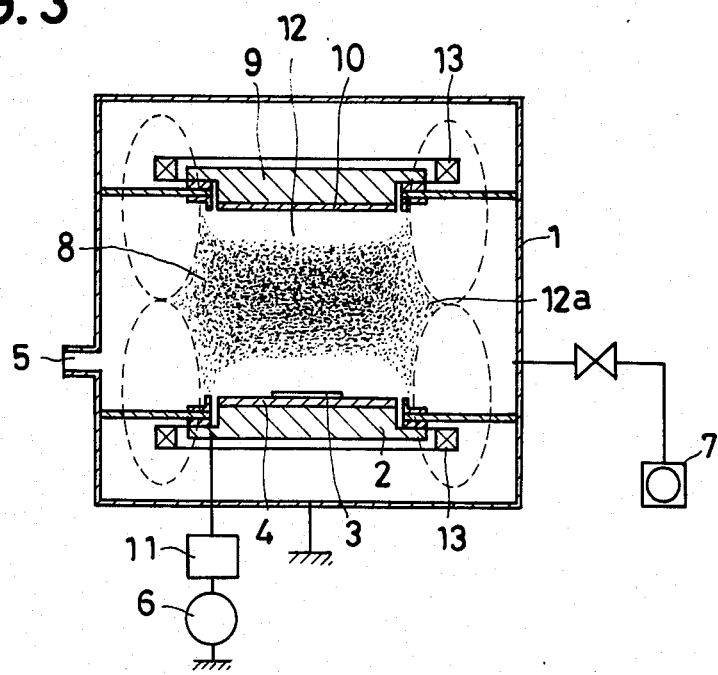
FIG. 3 is a sectional side view of another embodiment of this invention.

The space 12 formed between the two electrodes 2, 9 has therearound a peripheral open region 12a connecting between the space 12 and the inlet opening 5 for introduction of the etching gas into the chamber 1 and, in this case, the plasma 8 is liable to diffuse radially into the peripheral open region 12a. For a greater increase in the plasma concentration in front of the electrode 2, it is desirable not only to restrict the plasma 8 from diffusing forward by the opposite electrode as mentioned above, but also to restrict the same from diffusing radially into the peripheral open region 12a without obstruction to introduction of the etching gas into the space 12. For achieving this desire, there is provided a magnet means 13, that is, a permanent magnet or an electromagnet as shown in FIG. 3, for instance.

This magnet means 13 is provided around each of the two electrodes 2,9 or around either one of the electrodes 2,9 for creating a magnetic field which extends substantially perpendicularly to the two electrodes 2, 9 and extends in the axial direction along the peripheral open region 12a so as to surround the space 12 between the two electrodes 2, 9. Thus, if this magnetic field is created, the magnetic field prevents the plasma 8 from diffusing radially into the peripheral open region 12a, so that the concentration of the plasma in the space 12 between the two electrodes 2, 9 can be further increased.

The shape of the surface of each of these electrodes 2, 9 is not limited to be a flat one, but may be a convex one, a concave one or any other desired one.

Next, the operation of this invention apparatus will be explained as follows:

If the vacuum treatment chamber 2 is evacuated to be in a vacuum condition and is charged with a slight amount of an etching gas such as Ar or the like, and the etching electrode 2 is applied with an electric power from the RF electric power source 6 to generate the plasma 8 in front of the electrode 2, there is created the plasma 8 in front of the electrode 2. Ions in the plasma rush to impinge on the etching electrode 2 of negative potential, and during this operation the ions impinge on the substrate 3 set on the electrode 2 for etching the same.

The foregoing operation is not especially different from that of the conventional example. In this invention, however, the opposite electrode 9 which is in the floating condition in terms of electricity is so provided as to face the etching electrode 2, as mentioned above, so that the generated plasma 8 in front of the electrode 2 is prevented from diffusing forwards. As a result, the concentration of the plasma in the space 12 can be increased without increasing in application of the electric power to the etching electrode 2. In addition, the increase of the plasma concentration increases the number of ions generated in space 12. Consequently, the number of ions impinging on the substrate 3 is increased and thereby the etching rate is increased.

In the case of the example shown if FIG. 3, there is provided the magnet means 13 so that the magnetic field established thereby may prevent the plasma 8 from diffusing radially into the peripheral open region 12a. As a result, the plasma concentration can be further increased and the rate of etching of the substrate 3 can be additionally improved.

Figure 1:
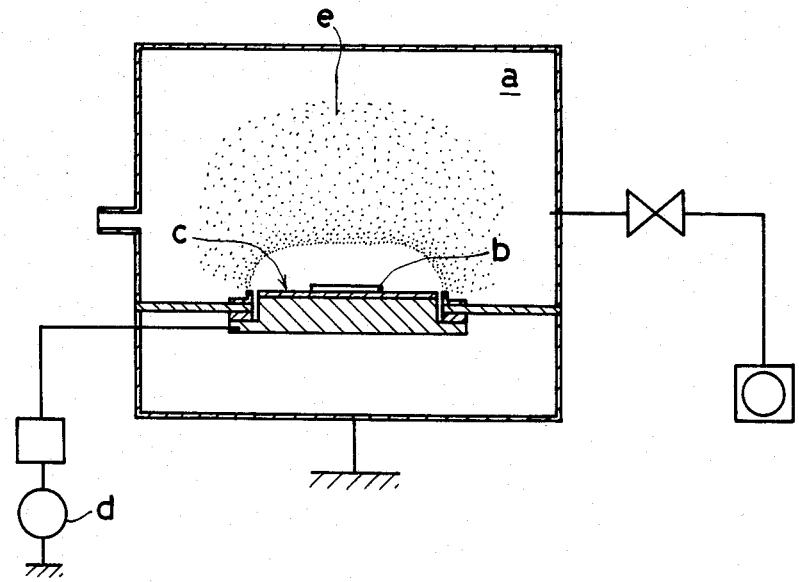
FIG. 1 is a sectional side view of a conventional example.
Figure 4:
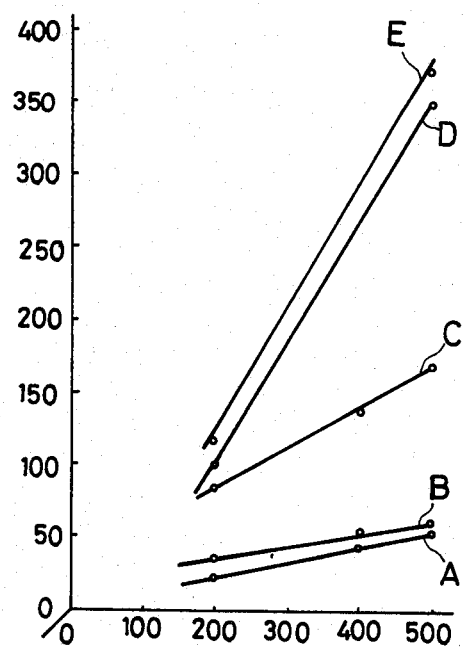
FIG. 4 is a diagram showing characteristic curves of etching rates.

Various tests were carried out for measuring specific etching rates. The results shown in FIG. 4 were obtained. A curve A in FIG. 4 shows etching rates obtained by the conventional example as shown in FIG. 1, a curve B shows etching rates obtained by the foregoing example shown in FIG. 2 in which there is provided the opposite electrode 9 in the floating condition, and curves C, D, E show etching rates obtained by the example shown in FIG. 3 in which there is provided not only the opposite electrode 9 in the floating condition, but also the magnet means 13. The curve C is the case that the intensity of the magnetic field is 20 gausses in the middle in the axial direction of the peripheral open region 12a, the curve D results from the case that that of the magnetic field is 40 gausses in the middle of the same as above, and the curve E results from the case that the magnetic field is 60 gausses in the middle of the same.

These tests have been carried out under the condition that the pressure in the chamber 1 is $2 \times 10_{-3}$ torr; the flow rate of Ar gas is 30 SCCM., the etching electrode 2 in a circular plate form is 180 mm in diameter; the opposite electrode 9 in a circular plate form is 200 mm in diameter; the distance between the two electrodes 2, 9 is 100 mm; and the electric power to be applied to the electrode 2 is changed to be 200 W, 300 W, 400 W and 500 W which are used in an ordinary conventional case.

It can be appreciated therefrom that the etching rate obtained by this invention apparatus as shown by the curves B, C, D, E is higher than that obtained by the conventional example, as shown by the curve A, if the electric power to be applied to the electrode 2 is constant, and that the etching rate obtained by this invention apparatus is equal to or higher than that obtained by the conventional apparatus even if the electric power to be applied is decreased.

Thus, according to this invention, with decrease in the applied electric power, an energy of ions impinging on the substrate 3 can be decreased so that the injury to the substrate by the impinging ions can be decreased. At the same time, with a comparatively low electric power, there is no generation of lattice defect on the substrate 3.

Such a test has been carried out that the apparatus shown in FIG. 3 is used and an etching treatment is applied to the silicon substrate 3 for two minutes under the condition that the applied electric power is 200 watts and the magnetic field is 60 gausses in the middle in the axial direction of the peripheral open region 12a. As a result, it has been confirmed that there is no lattice defect generated in the substrate 3. This means that this invention apparatus is convenient for forming a fine pattern on the surface of the substrate 3 by the etching treatment.

Thus, according to a first feature of this invention, an opposite electrode is provided to be in an electrically floating condition and face a sputter etching electrode so that a plasma generated in a space between the two electrodes can be prevented from being diffused forwards to result in an increase in its concentration. Consequently, an etching rate can be increased without increasing in application of an electric power to the etching electrode. In addition, the etching electrode can be lowered in its potential and, thereby, an energy of ions impinging on the substrate can be lowered to prevent the substrate from being injured. According to a second feature of this invention, there is additionally provided a magnet means for establishing a magnetic field for confining the plasma in the space by surrounding the same, so that the plasma can be further prevented from being diffused and, as a result, the etching rate can be more improved and the injury to the substrate can be further decreased.

What is claimed is:

1. A sputter etching apparatus comprising:
    an evacuatible vacuum treatment chamber,
    a sputter etching electrode mounted in said chamber for supporting a substrate to be etched,
    means for evacuating said chamber,
    means for introducing an etching gas into said evacuated chamber,
    means for supplying electric power to said electrode for generating a plasms from said etching gas in said chamber,
    an opposite electrode mounted in said chamber in an electrically floating condition facing said sputter etching electrode for confining the plasma in the space formed between said opposite electrode and said sputter etching electrode, said opposite electrode being electrically insulated from contact with said chamber and from direct connection with said means for supplying electric power, and
    magnet means mounted in said chamber for generating a magnetic field which extends substantially perpendicularly to said opposite electrode and said sputter etching electrode and extends in an axial direction along a peripheral open region surrounding said space so that the plasma is confined in said space.

2. The apparatus as claimed in claim 1, wherein said magnet means comprises two annular permanent magnets mounted around said sputter etching electrode and said opposite electrode respectively.

3. An apparatus as claimed in claim 1, wherein said means for supplying electric power is an RF power source producing 200–500 watts, and said magnet means produces a magnetic field having an intensity of 20–60 gauss in an axial direction of the peripheral open region.

* * * * *